(12) United States Patent
Johnson

(10) Patent No.: US 7,177,224 B2
(45) Date of Patent: Feb. 13, 2007

(54) CONTROLLING MULTIPLE SIGNAL POLARITY IN A SEMICONDUCTOR DEVICE

(75) Inventor: Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 684 days.

(21) Appl. No.: 10/442,789

(22) Filed: May 21, 2003

(65) Prior Publication Data

US 2004/0236970 A1  Nov. 25, 2004

(51) Int. Cl.
*G11C 8/00* (2006.01)

(52) U.S. Cl. .............................. 365/230.06; 365/189.07

(58) Field of Classification Search ........... 365/230.06, 365/189.07
See application file for complete search history.

(56) References Cited

U.S. PATENT DOCUMENTS

| 6,678,811 B2 * | 1/2004 | Rentschler et al. ......... 365/194 |
| 6,687,185 B1 * | 2/2004 | Keeth et al. ................. 365/233 |
| 7,103,793 B2 * | 9/2006 | Rentschler et al. ......... 365/193 |

* cited by examiner

*Primary Examiner*—Tuan T. Nguyen
(74) *Attorney, Agent, or Firm*—Williams, Morgan & Amerson, P.C.

(57) ABSTRACT

A method and apparatus for controlling multiple signal polarity in a memory device. A desired active state signal polarity of at least one signal pad of a device is compared to a default active state signal polarity allocated to the at least one signal pad. The desired and default active state signal polarities have either a high active state or a low active state. The active state signal polarity of the at least one signal pad is reversed in response to the desired active state signal polarity differing from the default active signal polarity.

28 Claims, 8 Drawing Sheets

CONTROLLING MULTIPLE SIGNAL POLARITY IN A SEMICONDUCTOR DEVICE

BACKGROUND OF THE INVENTION

1. Field of the Invention

This invention generally relates to a semiconductor memory device, and, in particular, to controlling multiple signal polarity in a semiconductor device based upon the particular usage of the semiconductor device.

2. Description of the Related Art

Modem integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256 K ($2^{18}$) memory cells.

Typically, the semiconductor memory has a plurality of signal pads for enabling or disabling certain electronic functions by providing signals on these signal pads. For example, a memory device may include a clock enable (CKE) signal pad and a data mask (DM) signal pad, among the various other signal pads that may be used by the memory for a variety of other functions. Typically, the CKE signal pad is used to generate a clock enable signal to implement a power-down or self-refresh mode of the memory; whereas, the DM signal pad is utilized to mask or unmask data stored within the memory. Usually, the CKE and DM signal pads are preconfigured by the manufacturer to be disposed in a particular state by default (i.e., these signal pads are usually put in a default active high state). If the user desires to enable a power down mode, for example, the CKE signal pad needs to be driven from the default active high state to a low state (i.e., pulled down low from Vcc) to perform the power saving function. Similarly, if the user does not desire to mask data, for example, the DM signal pad must also be driven from the default active high state to a low state to disable the data masking function of the memory device. Often, some signals have to be driven to an opposite state, as opposed to its default active state, for certain applications. In other words, some applications of devices, such as memory devices, may require active high signals to be pulled low for a substantial amount of time.

By changing the states of these signal pads (i.e., from a high state to a low state) typically requires more current to do so, and, consequently, increases the power drain on the memory when a memory device has on-die termination. When the memory device has on-die termination to Vcc, there may be a current draw when driving the a signal pad to a logic low state. Conversely, when the memory device has an on-die termination to Vss, there may be a current draw when driving a pin to a logic high state. Therefore, more current is drawn when the signal pad is pulled down from Vcc to ground on an on-die termination to Vcc (or when the pad is pulled high from Vss on a on-die termination to Vss) to enable the function of the signal pad. This becomes even more problematic when the memory is implemented in a portable configuration (e.g., a portable computer) with a limited supply of power. For example, if the user does not desire to mask data the majority of the time, then more current drain typically results (and, thus a larger power drain) in order to drive the DM signal pad from its default active high state to the desired active low state such that data that is stored within the memory would not be masked.

The present invention is directed to overcoming, or at least reducing, the effects of, one or more of the problems set forth above.

SUMMARY OF THE INVENTION

One aspect of the present invention is seen in a method. The method comprises comparing a desired active state signal polarity of at least one signal pad of a device to a default active state signal polarity allocated to the at least one signal pad. The desired and default active state signal polarities have either a high active state or a low active state. The method further comprises reversing the active state signal polarity of the at least one signal pad in response to the desired active state signal polarity differing from the default active signal polarity.

Another aspect of the present invention is seen in an apparatus. The apparatus comprises at least one signal pad for providing a signal thereon, and a controller adapted to compare a desired active state signal polarity of the at least one signal pad to a default active state signal polarity allocated to the at least one signal pad. The desired and default active state signal polarities have either a high active state or a low active state. The controller is further adapted to reverse the active state signal polarity of the at least one signal pad in response to the desired active state signal polarity differing from the default active state signal polarity.

Another aspect of the present invention is seen in a method. The method includes providing a default active state polarity for a signal pad of a device, determining a desired active state polarity for the signal pad, and modifying the default active state polarity of the signal pad based at least upon the desired active state polarity.

Another aspect of the present invention is seen in a memory device. The memory device comprises at least one signal pad for providing a signal thereon. A first controller is also provided and adapted to compare a desired active signal polarity of the at least one signal pad to a default active signal polarity allocated to the at least one signal pad. The desired and default active signal polarities have either a high active state or a low active state. A second controller is further provided and adapted to produce a control signal to reverse the active signal polarity of the at least one signal pad in response to the desired active polarity differing from the default active polarity.

BRIEF DESCRIPTION OF THE DRAWINGS

The invention may be understood by reference to the following description taken in conjunction with the accompanying drawings, in which like reference numerals identify like elements, and in which.

Figure 1:
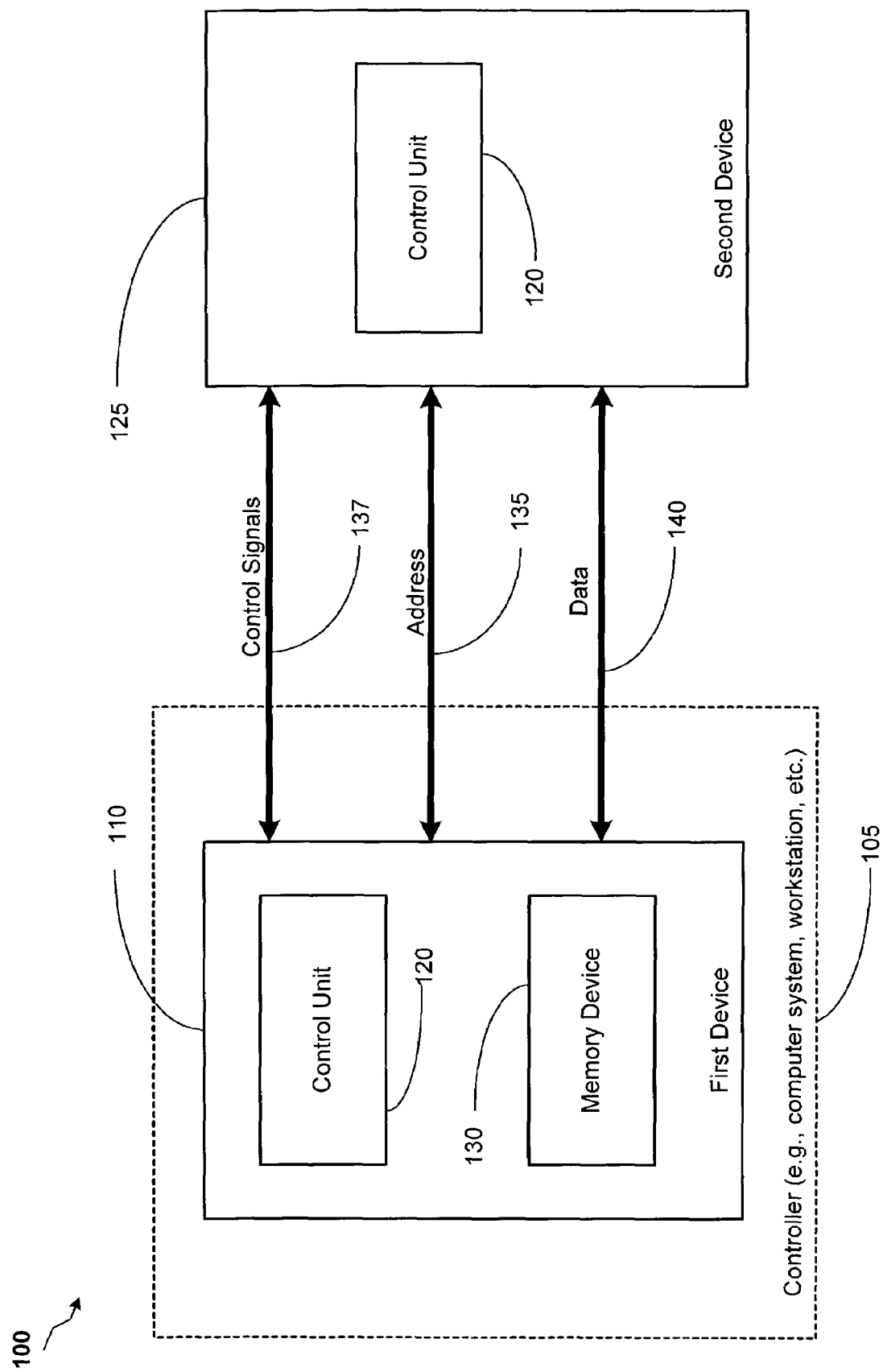
FIG. 1 is a block diagram of a system including a memory device in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a block diagram of a system 100 is provided in accordance with one illustrative embodiment of the present invention. The system 100 comprises a first device 110, which, in one embodiment, may comprise a memory device 130 capable of storing data. In the illustrated embodiment, the memory device 130 may take the form of a dynamic random access memory (DRAM). It will be appreciated, however, that the memory device 130 may alternatively take the form of a static random access memory (SRAM), a double-data rate synchronous DRAM (DDR SDRAM), a Rambus™ DRAM (RDRAM), a FLASH memory unit, and the like without departing from the spirit and scope of the present invention.

In one embodiment of the present invention, the first device 110 may be encompassed by a controller 105, which may be a computer system, (e.g., a PC-computer, workstation, etc.), and the like. The controller 105 may also take the form of a system board, such as a motherboard for a computer system, for example.

The first device 110 may be accessed by a second device 125, which, in one embodiment, may take the form of a memory access device. The second device 125 may send addresses on an address line 135 to the first device 110. The first device 110 may then provide data to the second device 125 on a data line 140 in response to receiving the addressing information over the address line 135. The first device 110 may also send and/or receive control signal on a line 137. These control signals may be used to control addressing, acquiring, and/or sending data to and from the first and second devices 110, 125. Although the system 100 is configured with two separate lines (i.e., the address line 135 and data line 140) in the illustrated embodiment, it will be appreciated that the address and data information may be communicated between the first and second devices 110, 125 over the same line or more than the two lines 135, 140 illustrated in FIG. 1 without departing from the spirit and scope of the present invention.

The first and second devices 110, 125 may comprise a control unit 120 capable of accessing data stored in the memory device 130 of the first device 110. The second device 125 may be any device that uses the first device 110 to store data, read data, or both. In varying embodiments of the present invention, the second device 125 may include, but need not necessarily be limited to, a computer, camera, telephone, television, radio, calculator, personal digital assistant, network switch, and the like. It will be appreciated that the second device may take the form of various other types of devices in addition to the aforementioned examples without departing from the spirit and scope of the present invention.

In accordance with one embodiment of the present invention, the control unit 120 may manage the overall operation of the second device 125, including writing and reading data to and from the memory device 130 of the first device 110. The control unit 120 may comprise a microprocessor, a microcontroller, a digital signal processor, a processor card (including one or more microprocessors or controllers), a memory controller, or other control or computing devices.

According to the illustrated embodiment, the first device 110 is embodied as a memory chip device that is implemented in a digital system, such as a computer system, for example. In an alternative embodiment, the first device 110 may be embodied as an external memory, such as a memory stick, for example, and may be accessed when inserted into a slot (not shown) of the second device 125. When inserted within the slot, the second device 125 may provide the appropriate power and control signals to access memory locations in the first device 110. The first device 110 may be external to, or internal to (i.e., integrated within) the second device 125. The second device 125 may employ the first device 110 (in the form of a memory device) that is integrated within the computer system to store data (e.g., BIOS (basic input/output system)) related to the computer system.

Figure 2:
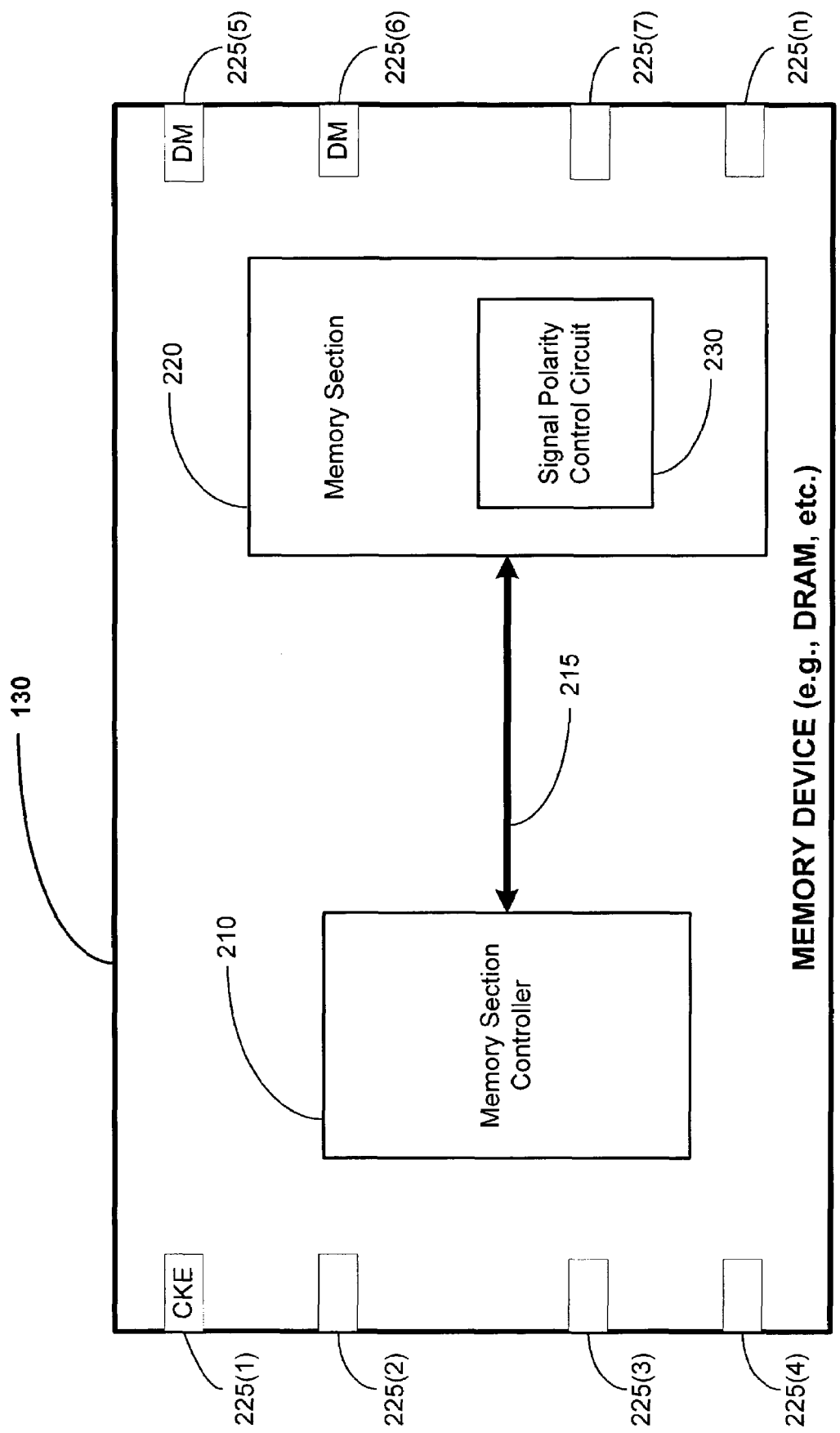
FIG. 2 is a more detailed block diagram representation of the memory device of FIG. 1 comprising a signal polarity control circuit in accordance with one illustrative embodiment of the present invention.

Turning now to FIG. 2, a more detailed representation of the memory device 130 is provided in accordance with one illustrative embodiment of the present invention. In this particular embodiment, the memory device 130 comprises a memory section controller 210, which is operatively coupled to at least one memory section 220 via a control line 215. The memory section controller 210 may include circuitry that provides access to control the operation of the memory device 130 (e.g., such as storing and extracting data to and from the memory section 220). The memory section 220 may be an array of memory-storing modules that are capable of storing data.

In accordance with the illustrated embodiment, the memory device 130 is configured with a plurality of signal pads 225(1–n). The signal pads 225(1–n) may be coupled with pins that may be used to affix the memory device 130 onto a PC board (e.g., the motherboard). The signal pads 225(1–n) may each have a particular signal polarity associated therewith (i.e., either a high active or low active state) for performing a variety of functions of the memory device 130. For example, particular pads of the plurality of signal pads 225(1–n) of the memory device 130 may include a clock enable (CKE) signal pad 225(1) and a data mask (DM) signal pad 225(5) among the various other signal pads 225 that may be used for a variety of other functions. Typically, the CKE signal pad 225(1) provides a clock enable signal that is used to implement a power down or self-refresh mode of the memory device 130; whereas, the DM signal pad 225(5) provides a data-mask signal that may be utilized to mask or unmask data stored within the memory section 220. Usually, the CKE and DM signal pads 225(1, 5) are pre-configured by the manufacturer to be disposed in a particular state (i.e., the signal pads 225 are usually put in a default active high state). Generally, both CKE and DM signal pads 225(1, 5), which are connected to pins on the memory device 130, represent control signals that are controlled by a memory controller associated with a processor.

Often, these signals are pulled-up to a voltage source (e.g., on-die or board level Vcc) via a pull-up resistor. When the user desires to enable a power down mode, for example, the CKE signal pad 225(1) needs to be driven from the default active high state to a low state (i.e., pulled down low from Vcc) to perform the power saving function. Similarly, if the user does not desire to mask data, for example, the DM signal pad 225(5) must also be driven from the default active high state to a low state to disable the data masking function of the memory section 220. However, pulling these signals low causes a current flow to occur from Vcc through a pull-up resistor to a logic low level (e.g., ground). As previously mentioned, it will be appreciated that the memory device 130 may implement several other signal pads 225 to perform various other functions of the memory device 130, and, thus, need not be limited to the aforementioned examples.

By changing the states of these signal pads 225(1–n) (i.e., from a high state to a low state) typically requires more current to do so, and, consequently, increases the power drain of the memory device 130. That is, more current is drawn when the signal pad 225(1–n) is pulled down from Vcc to ground to enable the function of the signal pad 225(1–n). This becomes even more problematic when the memory device 130 is implemented in a portable configuration (e.g., a portable computer) with a limited supply of power. For example, if the user does not desire to mask data the majority of the time, it typically requires more current drain (and, thus a larger power drain) on the memory device 130 to drive the DM signal pad 225(5) from its default active high state to the desired active low state such that data that is stored within the memory section 220 would not be masked.

In accordance with the present invention, the memory section 220 is configured with a signal polarity control circuit 230, which enables the signal pads 225(1–n) of the memory device 130 to be configured to have a desired active state polarity that is in alignment with the desired functions to be performed by the user most often. In other words, the signal polarity control circuit 230 may be used to configure certain pins or signal pads 225(1–n) to either an active high or active low state based upon a particular function that is to be implemented by the memory device 130. Therefore, the signal polarity control circuit 230 may be used to customize the active state polarity of the signal pads 225(1–n) such that particular functions of the memory device 130 that are implemented frequently do not require a substantial increase in the current drain experienced by the memory device 130 as a result of having to frequently pull the signal pad 225(1–n) from Vcc.

Figure 3:
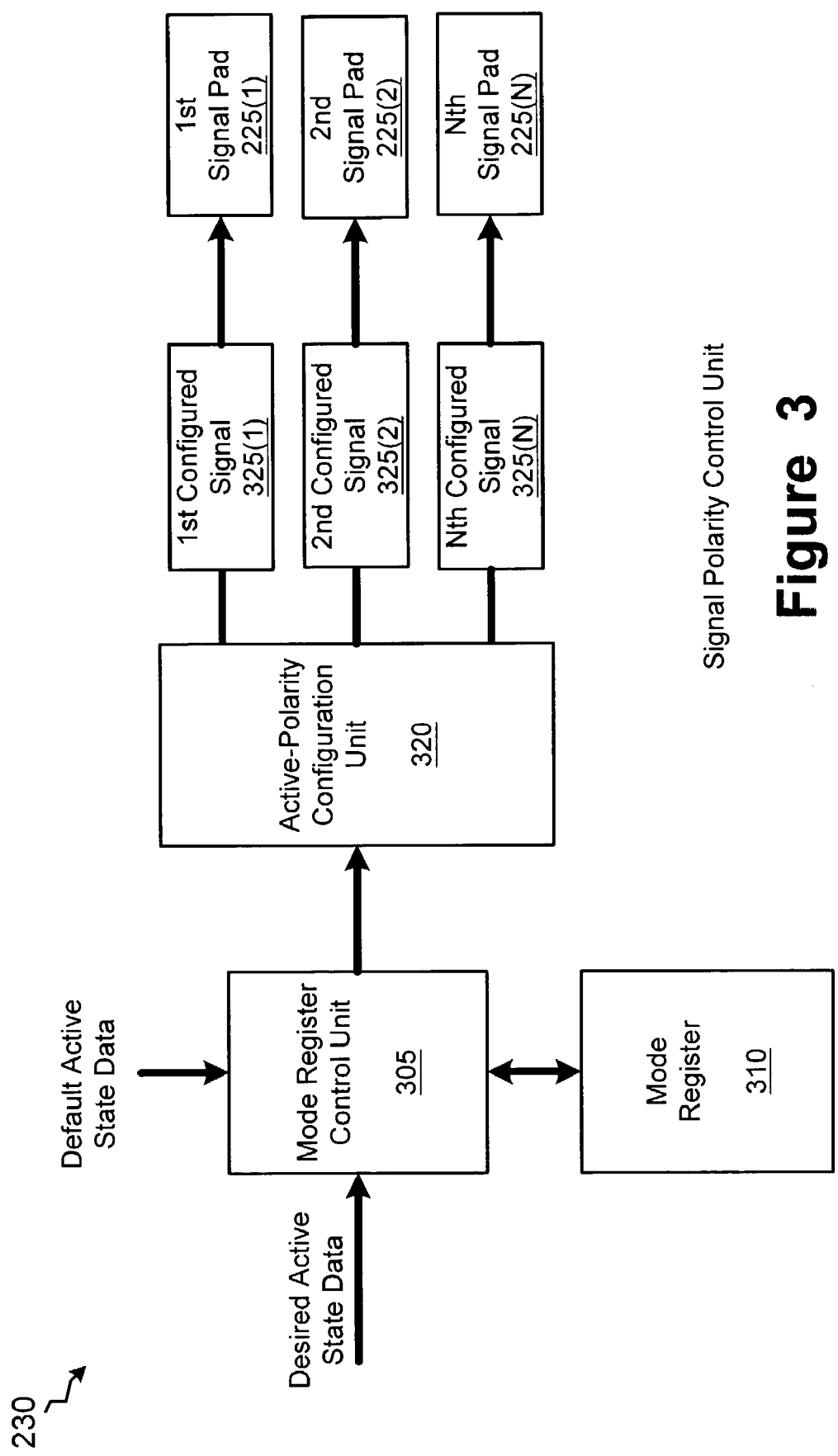
FIG. 3 illustrates a more detailed representation of the signal polarity control unit of FIG. 2 in accordance with one illustrative embodiment of the present invention.

Turning now to FIG. 3, a more detailed representation of the signal polarity control circuit 230 of the memory section 220 is shown in accordance with one embodiment of the present invention. In this particular embodiment, the memory section controller 210 sends a data signal to a mode register control unit 305 that indicates the likely active state of the signals (i.e., desired active state data) for the signal pads 225(1–n) of the memory device 130. The data signal sent to the mode register control unit 305 is based upon the user's particular use of the memory device 130. For example, if a particular application calls for not using the data mask function on a frequent basis, then the active state would advantageously set from high to low. In accordance with one embodiment, a user may provide this data relating to the likely active states of the signal pads 225(1–n) to the memory section controller 210. In an alternative embodiment, the memory section controller 210 may be configured to monitor the user's operation of the memory device 130, and send the desired active state data (i.e., either an active high or low state) of the signal pads 225(1–n) to the mode register control unit 305. For example, if the memory section controller 210 determines that the user typically does not mask data when writing data into the memory section 220, the memory section controller 210 forwards this determination to the mode register control unit 305 that indicates that the DM signal pad 225(5) should be set to an active low state to prevent data masking (i.e., the signal polarity relating to the active state of the signal pad 225(5) is reversed). Of course, it will be appreciated that each pad of the plurality of signal pads 225(1–n) may be allocated to various other functions, and, thus, need not be limited to the data masking example provided.

In accordance with the illustrated embodiment, the mode register control unit 305 may have stored therein data relating to the default active state configurations for each of the signal pads 225(1–n) of the memory device 130. This data relating to the default active states (i.e., either an active high or low state) for each of the signal pads 225(1–n) of the memory device 130 may be set by the manufacturer of the unit 130 during the manufacture thereof.

In accordance with one embodiment, the mode register control unit 305 compares the desired active state data of the signal pads 225(1–n) of the memory device 130 to the default active state configurations of the corresponding signal pads 225(1–n). If the desired active state data of a particular signal pad 225(n) differs from the default active state value for that signal pad 225(n), the mode register control unit 305 prompts a mode register 310 to indicate a change in the default active state configuration for the particular signal pad 225(n). The mode register control unit 305 then sends a control signal to an active-polarity configuration unit 320. The active-polarity configuration unit 320 is capable of generating one or more signals that are configured to be either active high or active low. The active-polarity configuration unit 320 sends a corresponding configured signal 325(1–n) to the corresponding signal pad 225(1–n) which now contains the desired signal that has the desired polarity or active state.

In accordance with an alternative embodiment of the present invention, the mode register control unit 305 compares the data relating to the desired active state data of the signal pads 225(1–n) to the default active state configurations of the corresponding signal pads 225(1–n). If the desired active state data of a particular signal pad 225(n) is different from the default active state of that signal pad 225(n), a determination is made whether the desired active state data of the signal pad 225(n) will cause the power consumption of the memory device 130 to exceed a predetermined power threshold level. If the desired active state data of the particular signal pad 225(n) will not cause the power consumption of the memory device 130 to exceed a predetermined power threshold level, the mode register control unit 305 may then leave the default active state for the particular signal pad 225(n) (because changing the active state of the signal pad 225(n) in this example will only cause a negligible power drain from the memory device 130). If, on the other hand, the desired active state data of the particular signal pad 225(n) will cause the power consumption of the memory device 130 to exceed a predetermined power threshold level, the mode register control unit 305 may then change the default active state for the particular signal pad 225(n) to conserve power.

Figure 4:
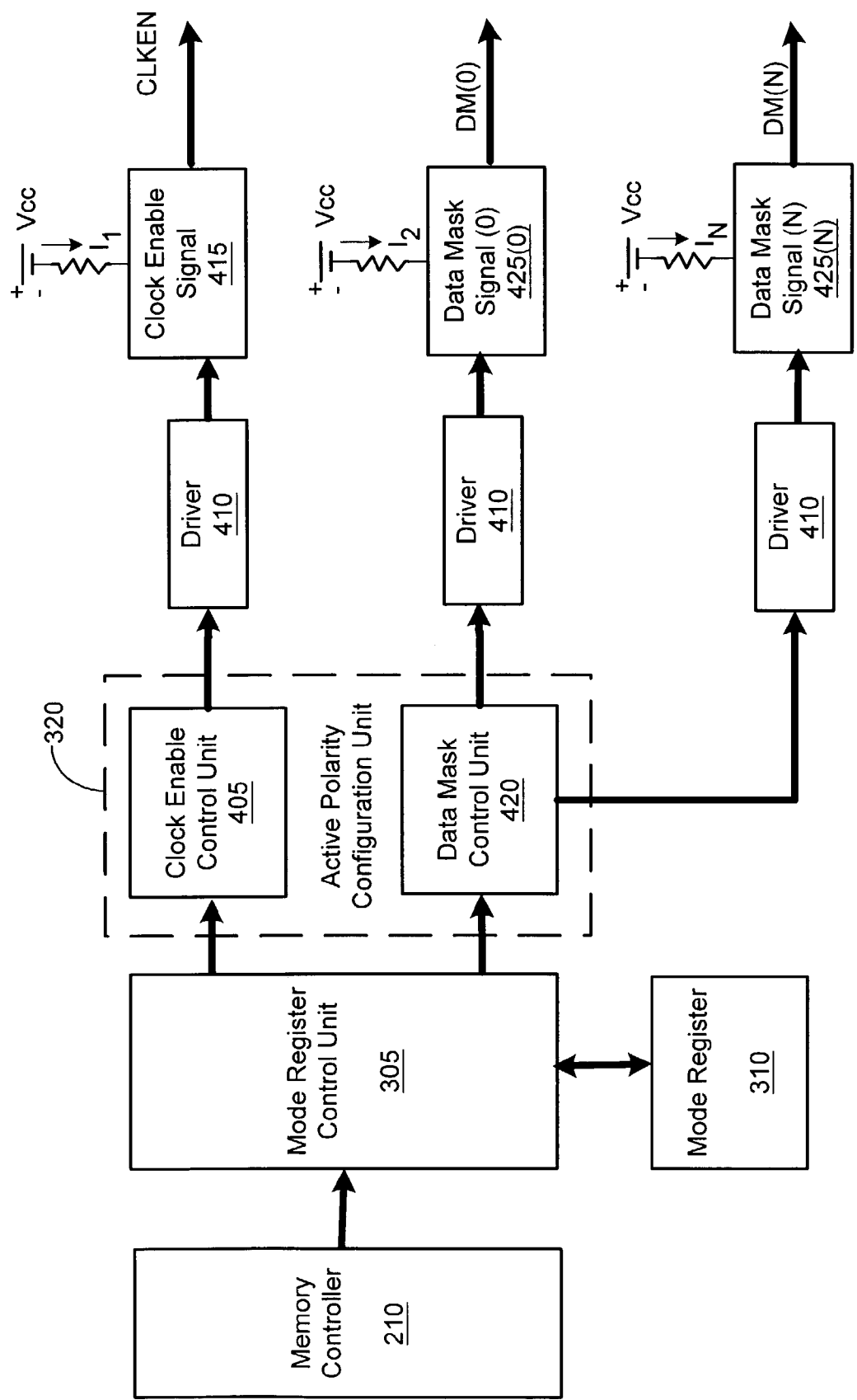
FIG. 4 illustrates a more detailed representation of the signal polarity control unit of FIG. 2 for implementing signal polarity control of signal pads enabling power saving and data masking functions in accordance with one illustrative embodiment of the present invention.

Turning now to FIG. 4, a block diagram for implementing signal polarity control for a clock enable (CKE) signal pad 225(1) and a plurality of data mask (DM) signal pads 225(5, 6) is shown in accordance with one embodiment of the present invention. It will be appreciated that although polarity control of the CKE and DM signal pads 225(1, 5, 6) is provided in the illustrated embodiment, the active states of various other types of signal pads 225 may be accomplished in a similar manner, and, thus, need not necessarily be limited to the aforementioned examples.

In accordance with one embodiment, the memory section controller 210 forwards data relating to the likely active state (i.e., desired active state data) of the CKE and DM signal pads 225(1, 5, 6) to the mode register control unit 305. The data relating to the likely active state of the CKE and DM signal pads 225(1, 5, 6) may be provided by a user to the memory section controller 210 based on the user's needs that may be associated with the CKE and DM signal pads 225(1, 5, 6). For example, if for a particular application, the user desires a power down mode often, the likely active state of the CKE signal pad 225(1) would be an active low state, which enables the power saving or self-refresh functions. Conversely, if the user typically does not desire to implement a power saving mode, the data indicating the likely state of the CKE signal pad 225(1) will be active high. Similarly, if the user typically desires not to implement data masking, the DM signal pads 225(5, 6) will be active low. Conversely, if the user prefers to implement data masking capabilities often, the data relating to the likely active state of the DM signal pads 225(5, 6) will be active high.

In an alternative embodiment, the memory section controller 210 may ascertain the desired active state data of the CKE and DM signal pads 225(1, 5, 6) based upon the user's past history of either implementing or not implementing these respective functions of the memory device 130. That is, if the user typically does not perform data masking capabilities based on the memory controller's monitoring of the data masking function of the memory section controller 210, then the memory section controller 210 may forward data to the mode register control unit 305 indicating that the desired active state data for the DM signal pads 225(5, 6) should be active low.

Upon receiving the desired active state data for the CKE and DM signal pads 225(1, 5, 6), the mode register control unit 305 compares the received data to the default states for the CKE and DM signal pads 225(1, 5, 6) that are stored therein. If the desired active state data of the CKE signal pad 225(1) differs from the default active state data for the CKE signal pad 225(1), the mode register control unit 305 will prompt the mode register 310 to indicate such, and send a control signal to a clock enable control unit 405 (within the active polarity configuration unit 320) to change the polarity of the CKE signal pad 225(1) from an active high state to an active low state. The clock enable control unit 405, upon receiving the control signal from the mode register control unit 305, may set the default active state of the CKE signal pad 225(1) from a high active state to a low active state by driving a signal to a driver 410, which in turn will generate the clock enable signal 415. Accordingly, if the user most often desires to implement a self-refresh mode, then for a signal that is pulled-up, an active-high version of CKE is desirable. With this configuration, the magnitude of the current $I_1$ generated for pulling the CKE signal pad 225(1) from Vcc to ground to enable the self-refresh mode is significantly reduced as a result of changing the polarity of the CKE signal pad 225(1) from a low active state to a high active state. As previously mentioned, the mode register control unit 305 may only send the control signal to change the polarity of the CKE signal pad 225(1) providing that by keeping the default active state value of the CKE signal pad 225(1) in a low active state would cause the memory device 130 to exceed a predetermined power level threshold.

If, on the other hand, the desired active state data of the CKE signal pad 225(1) is the same as the default active state data for the CKE signal pad 225(1), the mode register control unit 305 will not send a control signal to the clock enable control unit 405 (or will send a signal to maintain the current state polarity), thereby keeping the default active state of the CKE signal pad 225(1). That is, if the self-refresh function is not used often by the user, the amount of current produced by $I_1$ to pull the CKE signal pad 225(1) from Vcc to ground should not be substantially large enough to warrant a change in the polarity of the CKE signal pad 225(1).

Upon receiving the desired active state data for the DM signal pads 225(5, 6) from the memory section controller 210, the mode register control unit 305 compares the received data to the default states for the DM signal pads 225(5, 6) that are stored therein. If the desired active state data of the DM signal pads 225(5, 6) respectively differs from the default active state data for the DM signal pads 225(5, 6), the mode register control unit 305 will program the mode register 310 to indicate as such, and send a control signal to a data mask control unit 420 (of the active polarity configuration unit 320) to change the polarity of the corresponding DM signal pads 225(5, 6) from an active high state to an active low state or vice versa. The data mask control unit 420, upon receiving the control signal from the mode register control unit 305, will then configure the data mask signal to an active high or low configuration based upon the control signal. The data mask control unit 420 will then send a configured data mask signal to a driver 410, which will in turn generate a corresponding data mask signal (DM0, N) 425(0, N) to the respective DM signal pads 225(5, 6). Accordingly, if the user most often desires not to implement data masking and the data masking signals are pulled high, the magnitude of the currents $I_2$, $I_N$ generated for pulling the respective DM signal pad 225(5, 6) from Vcc to ground to disable the data masking mode is significantly reduced as a result of changing the polarity of the respective DM signal pads 225(5, 6) from a high active state to a low active state. This is true since the DM signals are inactive most of the time in this example, and they are pulled up to Vcc, thus in an active low state (inactive high) will result in reducing $I_2$ and $I_n$.

As previously mentioned, the mode register control unit 305 may only send the control signal to change the polarity of the respective DM signal pads 225(5, 6) providing that by only keeping the default active state value of the DM signal pads 225(5, 6) in a high active state would cause the memory device 130 to exceed a predetermined power level threshold.

If, on the other hand, the desired active state data of the respective DM signal pads 225(5, 6) are the same as the default active state data for the DM signal pads 225(5, 6), the mode register control unit 305 will not send a control signal to the data mask control unit 420, thereby keeping the default active state of the respective DM signal pads 225(5, 6). That is, if the data mask function is often utilized by the user, the amount of current produced by $I_2$, $I_N$ to pull the respective DM signal pads 225(5, 6) from Vcc to ground should not be substantially large enough to warrant a change in the polarity of the DM signal pads 225(5, 6). In an alternative embodiment, the mode register 310 may provide data to the active polarity configuration unit 320 to prompt it to retain the current status of active polarity if such a configuration would result in a reduced $I_1$, $I_2$, or $I_N$.

Figure 5:
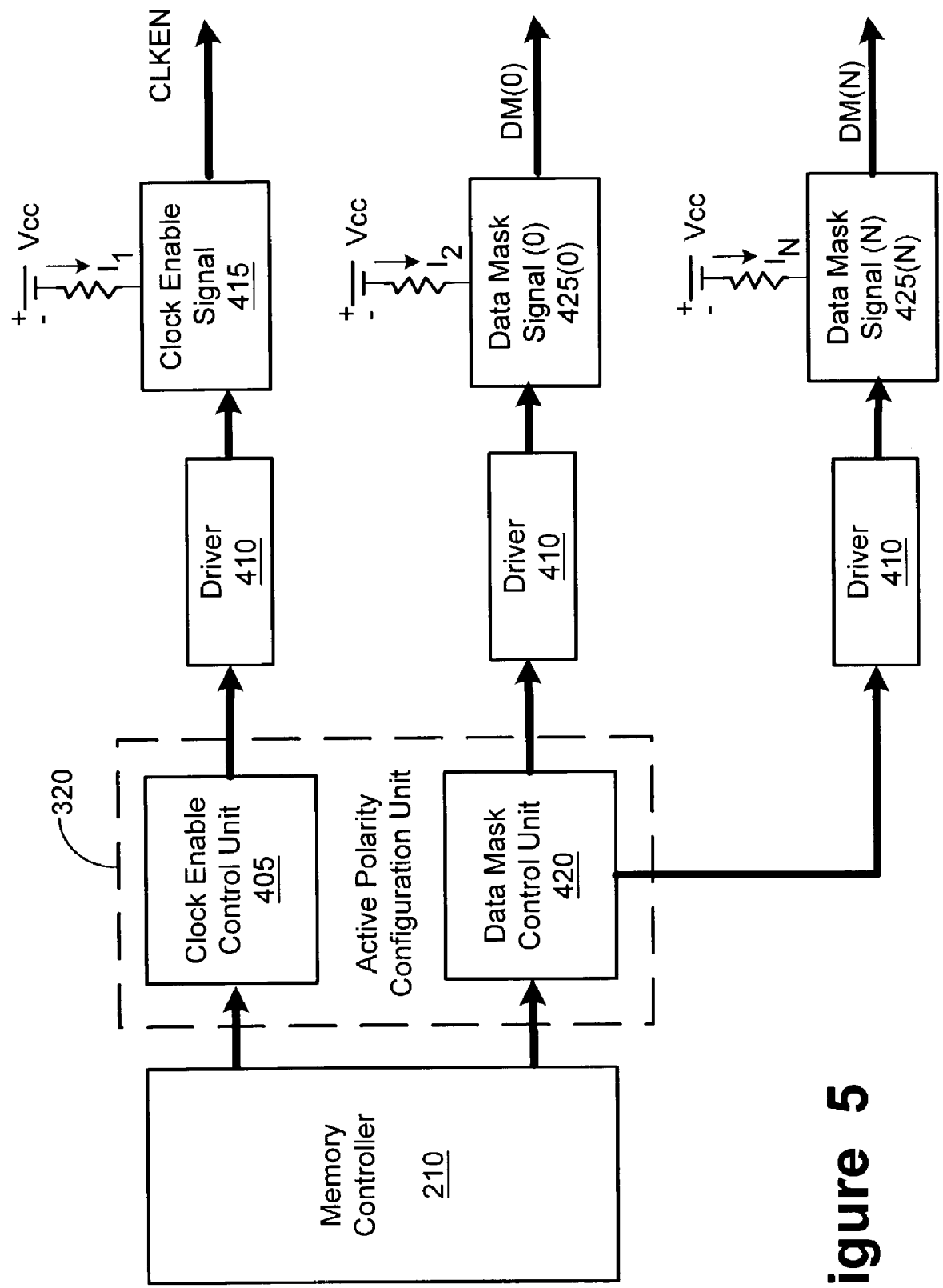
FIG. 5 illustrates another detailed representation of the signal polarity control unit of FIG. 2 for implementing signal polarity control of signal pads enabling power saving and data masking functions in accordance with another embodiment of the present invention.

Turning now to FIG. 5, an alternative embodiment of the present invention is shown to that of FIG. 4. In this particular embodiment, the memory section controller 210 sends the control signals to the clock enable control unit 405 and data mask control unit 420 of the active polarity configuration unit 320 directly. That is, in accordance with the embodiment provided in FIG. 5, the functionality of the mode register control unit 305 and mode register 310 is incorporated into the memory section controller 210 as opposed to being separate therefrom. Therefore, the memory section controller 210, in this particular embodiment, compares the desired active state data to the default active state data for the signal pads 225(1–n), and forwards a control signal to the active polarity configuration unit 320 based upon its analysis of the aforementioned data.

Figure 6:
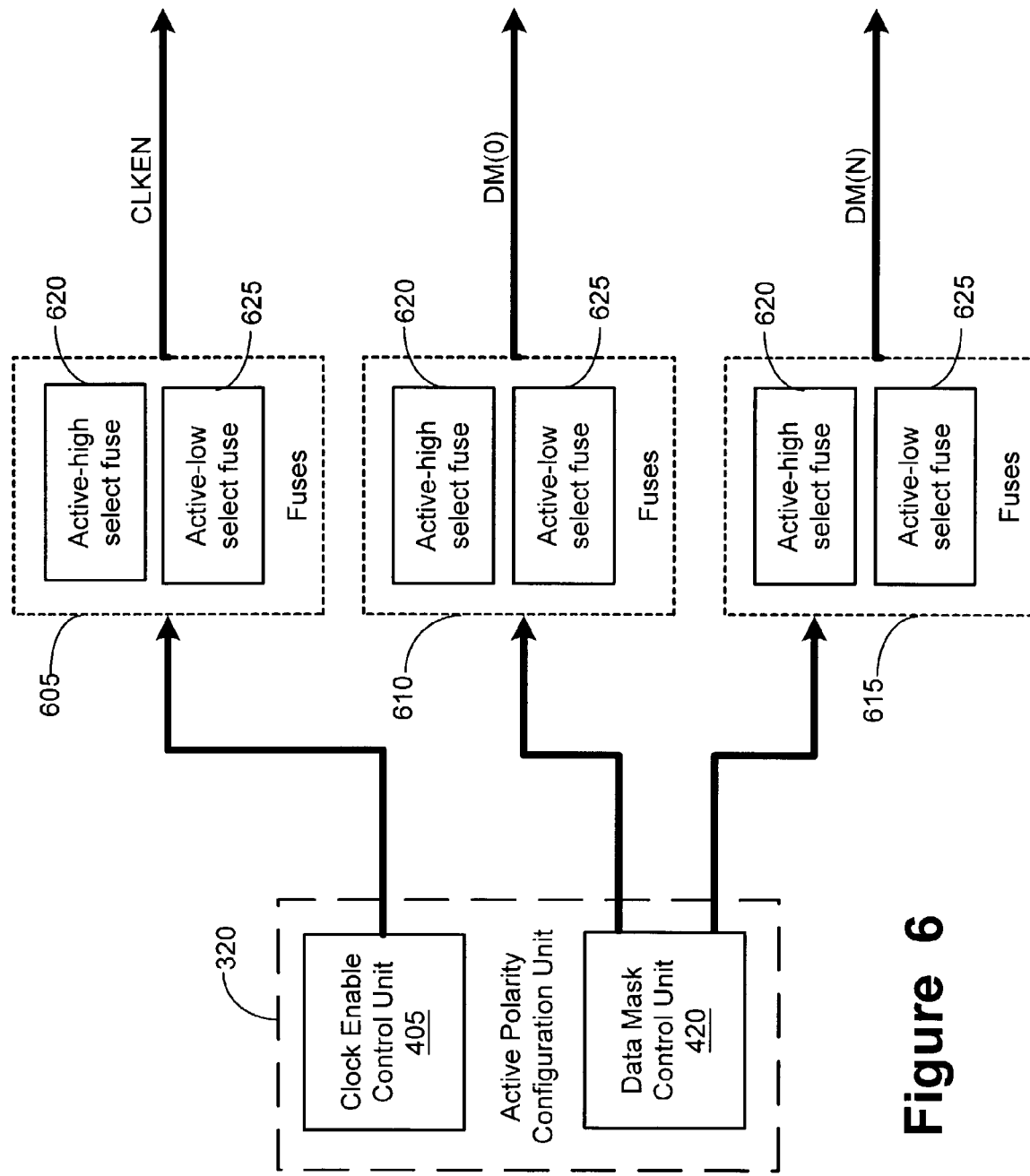
FIG. 6 illustrates a block diagram for providing active polarity control of signals on the signal pads of the memory device of FIG. 2 in accordance with yet another alternative embodiment of the present invention.

Turning now to FIG. 6, a block diagram for implementing signal polarity control for the clock enable (CKE) signal pad 225(1) and the data mask (DM) signal pads 225(5, 6) is shown in accordance with an alternative embodiment of the present invention. In this particular embodiment, fuses 605, 610, 615 may be utilized to change the active polarity of the CKE and DM signal pads 225(1, 5, 6). The fuses 605, 610, 615 may comprise an active-high select fuse 620 and an active-low select fuse 625. A control signal received by the fuses 605, 610, 615 may be selected either by the active high or low select fuses 620, 625 to configure the active state polarity of the CKE and DM signals. The memory section controller 210 may provide the respective control signals to the clock enable control unit 405 and data mask control unit 420 of the active polarity configuration unit 320 to change the signal polarity of the CKE signal pad 225(1) and the DM signal pads 225(5, 6). If a change in active polarity of the CKE signal pad 225(1) is desired by the memory section controller 210, the clock enable control unit 405 may be configured to send a control signal to the fuse 605 to select an active high select fuse 620 or active low select fuse 625 to change the active polarity of the CKE signal pad 225(1). If, on the other hand, it is desired not to change the active polarity of the CKE signal pad 225(1) (i.e., the desired active state data is the same as the default active state data, as previously described), then the clock enable control unit 405 may not send a control signal to the fuse 605 because an active high select fuse 620 is still active by its default setting. However, after the selection of the active low select fuse 625, a control signal may be sent from the clock enable control unit 405 to switch from the active low select fuse 625 to the active high select fuse 620, if so desired.

If a change in signal polarity of the DM signal pads 225(5, 6) is desired by the memory section controller 210, the data mask control unit 420 may be configured to send a control signal to the fuses 610 and/or fuses 615 to select an active high select fuse 620 or an active low select fuse 625 to change the active polarity of either or both of the DM signal pads 225(5, 6). If, on the other hand, it is desired not to change the signal polarity of the DM signal pads 225(5, 6) (i.e., the desired active state data is the same as the default active state data, as previously described), then the data mask control unit 420 may not send a control signal to the fuse 610 and/or fuse 615 because an active high select fuse 620 would be still active by its default setting. Therefore, using the fuses 605, 610, 620, the active states of various signals on the pads 225(1–n) may be modified as desired.

Figure 7:
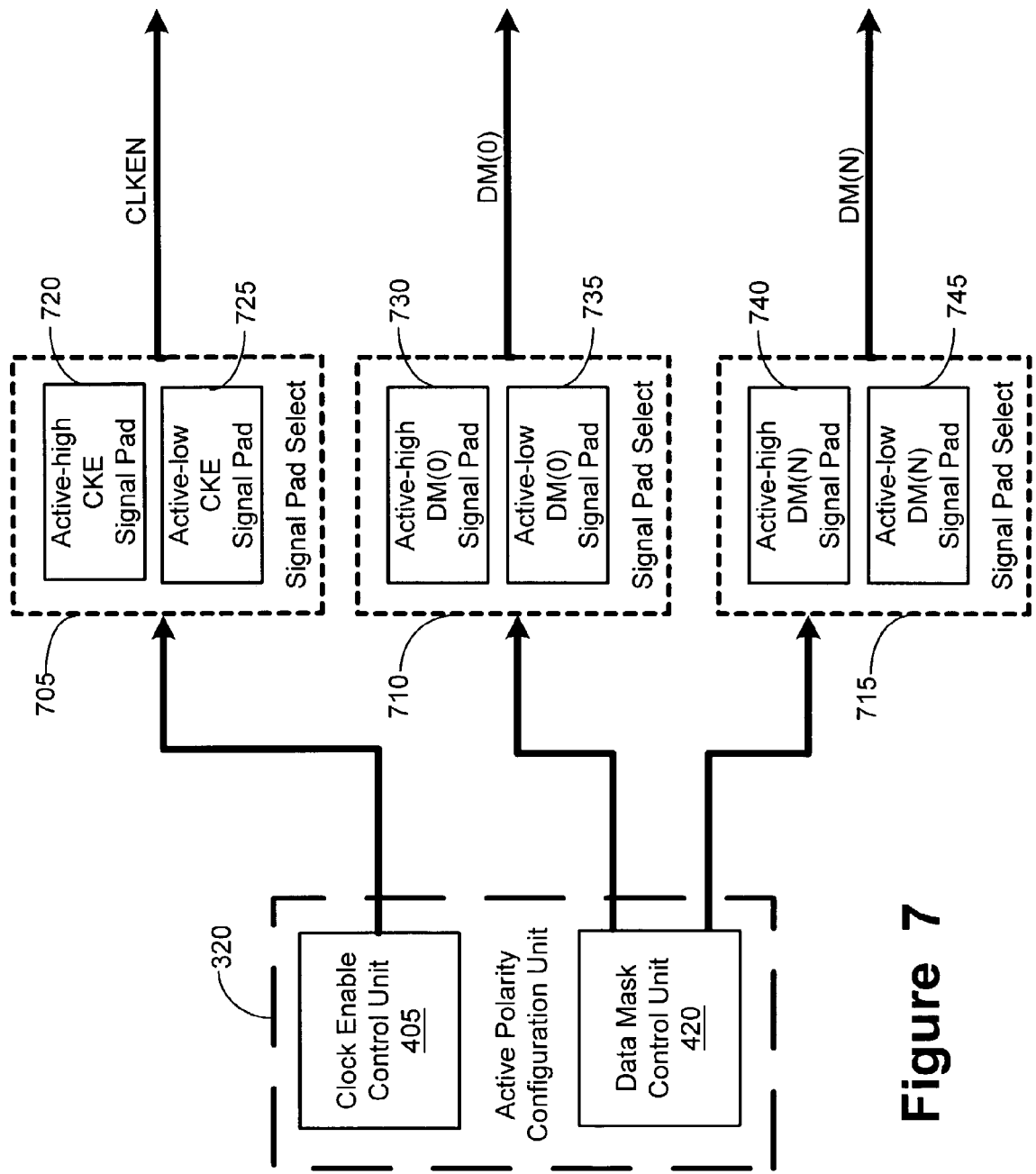
FIG. 7 illustrates a block diagram for providing active polarity control of signals on the signal pads of the memory device of FIG. 2 in accordance with yet another alternative embodiment of the present invention.

Turning now to FIG. 7, a block diagram for implementing signal polarity control for the clock enable (CKE) signal pad and the data mask (DM) signal pads is shown in accordance with an alternative embodiment of the present invention. In this particular embodiment, signal pad select units 705, 710, 715 may be utilized to select one of two signal pads allocated to a particular signal. The memory section controller 210 may provide the respective control signals to the clock enable control unit 405 to select an active-high CKE signal pad 720 or an active-low CKE signal pad 725. Accordingly, two signal pads 720, 725 are separately provided to enable either an active high CKE state or an active low CKE state by selection. That is, two signal pads are allocated to the CKE function (i.e., signal pad (active-high CKE) 720 and signal pad (active-low CKE) 725). Similarly, the data mask control unit 420 of the active polarity configuration unit 320 may select an active high DM signal pad 730, 740 or an active low DM signal pad 735, 745 from the respective signal pad select units 710, 715 depending on whether it is desirable to have the DM signal pads designated as having an active high or active low state.

Figure 8:
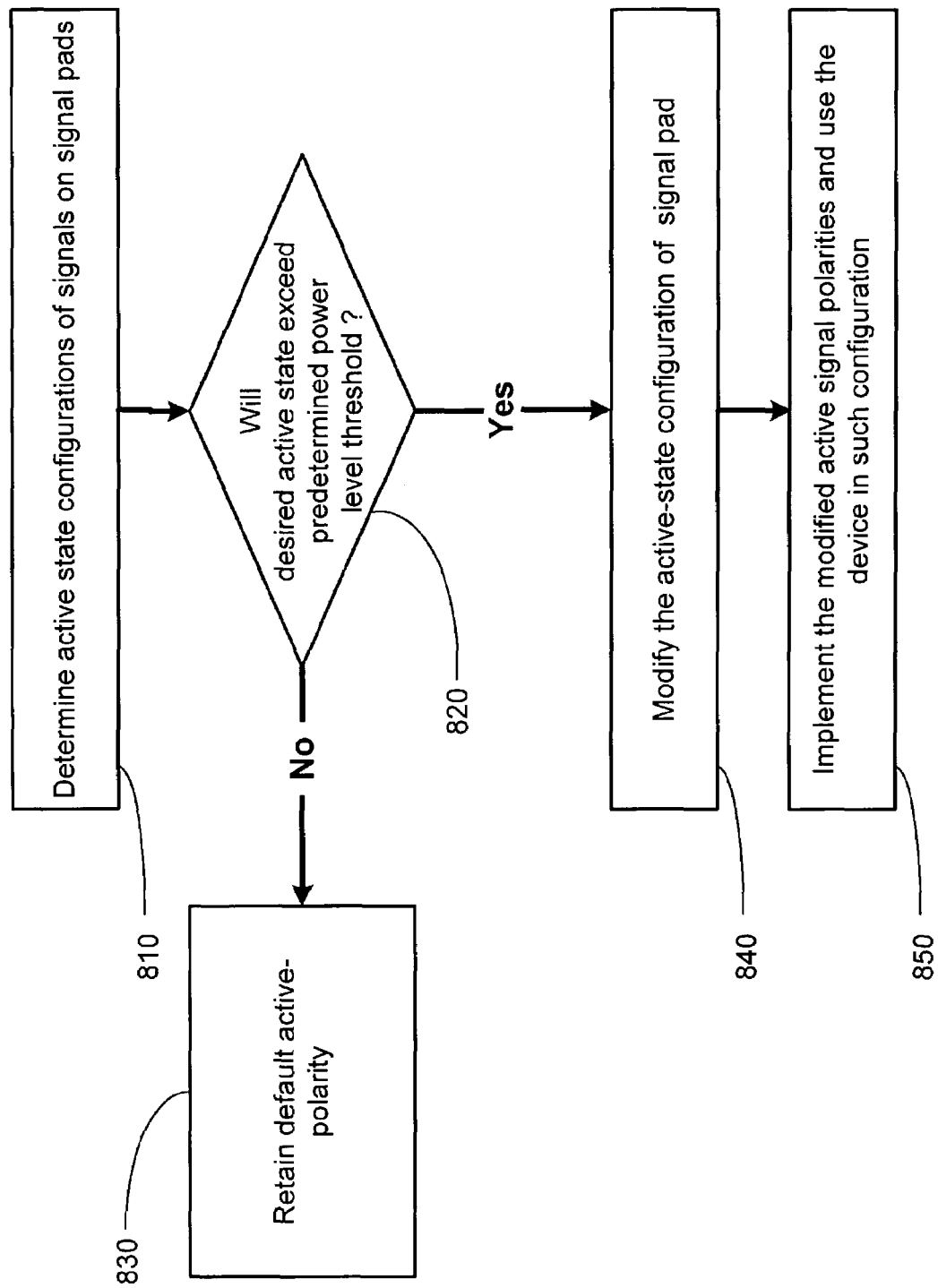
FIG. 8 shows a process in flowchart form for altering the signal polarity of the signal pads of the memory device of FIG. 2 in accordance with one illustrative embodiment of the present invention.

Turning now to FIG. 8, a process for altering the signal polarity of a plurality of signal pads 225(1–n) of the memory device 130 is shown in accordance with one embodiment of the present invention. At block 810, the active state configurations (i.e., active high or active low) of the signals on their respective signal pads 225(1–n) is determined. In accordance with one embodiment, the memory section controller 210 sends a data signal to a mode register control unit 305 that indicates the likely active state of the signals (i.e., desired active state data) for the signal pads 225(1–n) of the memory device 130 based upon the user's particular use of the memory device 130. In one embodiment, a user may provide this data relating to the likely active states of the signal pads 225(1–n) to the memory section controller 210. In an alternative embodiment, the memory section controller 210 may be configured to monitor the user's operation of the memory device 130, and send the desired active state data (i.e., either an active high or low state) of the signal pads 225(1–n) to the mode register control unit 305. The mode register control unit 305 may have stored therein data relating to the default active state configurations for each of the signal pads 225(1–n) of the memory device 130. This data relating to the default active states (i.e., either an active high or low state) for each of the signal pads 225(1–n) of the memory device 130 may be set by the manufacturer of the unit 130 during the manufacture thereof.

The mode register control unit 305 compares the data relating to the desired active state data of the signal pads 225(1–n) to the default active state configurations of the corresponding signal pads 225(1–n). If the desired active state data of a particular signal pad 225(n) is different from the default active state of that signal pad 225(n), it is determined if the desired active state data of the signal pad 225(n) will cause the power consumption of the memory device 130 to exceed a predetermined power threshold level at block 820. If the desired active state data of the particular signal pad 225(n) will not cause the power consumption of the memory device 130 to exceed a predetermined power threshold level, the mode register control unit 305 will then retain the default active state for the particular signal pad 225(n) at block 830. If, on the other hand, the desired active state data of the particular signal pad 225(n) will cause the power consumption of the memory device 130 to exceed a predetermined power threshold level in block 820, the mode register control unit 305 will then send a control signal to the active polarity configuration unit 320 to change the default active state for the particular signal pad 225(n) at block 840 to conserve power. The modification of the active state of the pads 225(n) may be implemented in a variety of manners, such as using a mode register, fuses, multiple signal pad selections, etc. At block 850, the active polarity configuration unit sends a configured signal that has a desired active state polarity to the respective signal pad 225(1–n).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
    at least one signal pad for providing a signal thereon; and
    a controller adapted to compare a desired active state signal polarity of the at least one signal pad to a default active state signal polarity allocated to the at least one signal pad, the desired and default active state signal polarities having either a high active state or a low active state; and
    wherein the controller is further adapted to reverse the active state signal polarity of the at least one signal pad in response to the desired active state signal polarity differing from the default active state signal polarity.

2. The apparatus of claim 1, wherein the controller is further adapted to determine if a predetermined power level threshold has been exceeded prior to reversing the active state signal polarity of the at least one signal pad.

3. The apparatus of claim 2, wherein the controller reverses the active state signal polarity of the at least one signal pad providing that the power level threshold has not been exceeded.

4. The apparatus of claim 2, wherein the controller retains the default active state signal polarity of the at least one signal pad providing that the power level threshold has been exceeded.

5. The apparatus of claim 1, wherein the controller determines the desired active state signal polarity of the at least one signal pad by a user of the apparatus.

6. The apparatus of claim 1, wherein the controller monitors a function that is associated with the at least one signal pad, and determines the desired active state signal polarity of the at least one signal pad based at least in part on the monitoring of the function that is associated with the at least one signal pad.

7. The apparatus of claim 1, wherein the apparatus comprises a memory device.

8. The apparatus of claim 7, wherein the memory device comprises at least one of a dynamic random access memory (DRAM), static random access memory (SRAM), a double-data rate synchronous DRAM (DDR SDRAM), a Rambus# DRAM (RDRAM), and a FLASH memory unit.

9. The apparatus of claim 1, wherein reversing the active state signal polarity of the at least one signal pad in response to the desired active state signal polarity differing from the default active signal polarity is achieved by selecting one of an active-high select fuse and an active-low select fuse.

10. The apparatus of claim 1, wherein reversing the active state signal polarity of the at least one signal pad in response to the desired active state signal polarity differing from the default active signal polarity is achieved by selecting one of an active-high signal pad and an active-low signal pad.

11. A memory device, comprising:
    at least one signal pad for providing a signal thereon; and
    a first controller adapted to compare a desired active signal polarity of the at least one signal pad to a default active signal polarity allocated to the at least one signal pad, the desired and default active signal polarities having either a high active state or a low active state; and
    a second controller adapted to produce a control signal to reverse the active signal polarity of the at least one signal pad in response to the desired active polarity differing from the default active polarity.

12. The memory device of claim 11, further comprising:
    a mode register for storing a result of the comparison performed by the first controller.

13. The memory device of claim 11, wherein the first controller is further adapted to determine if a predetermined power level threshold has been exceeded prior to reversing the active signal polarity of the at least one signal pad.

14. The memory device of claim 11, wherein the first controller is further adapted to determine if a predetermined power level threshold has been exceeded prior to reversing the active signal polarity of the at least one signal pad.

15. The memory device of claim 14, wherein the second controller reverses the active signal polarity of the at least one signal pad providing that the power level threshold has not been exceeded.

16. The memory device of claim 14, wherein the second controller retains the default active signal polarity of the at least one signal pad providing that the power level threshold has been exceeded.

17. The memory device of claim 11, wherein the first controller determines the desired active signal polarity of the at least one signal pad by a user of the apparatus.

18. The memory device of claim 11, wherein the first controller monitors a function that is associated with the at least one signal pad, and determines the desired active signal polarity of the at least one signal pad based at least in part on the monitoring of the function that is associated with the at least one signal pad.

19. The memory device of claim 11, wherein the second controller is adapted to produce a control signal to reverse the active signal polarity of the at least one signal pad by selecting one of an active-high select fuse and an active-low select fuse.

20. The memory device of claim 11, wherein the second controller is adapted to produce a control signal to reverse the active signal polarity of the at least one signal pad by selecting one of an active-high signal pad and an active-low signal pad.

21. A computer system, comprising:
a device including at least one signal pad for receiving a signal thereon; and
a controller for providing a default active state polarity for the signal pad, determining a desired active state polarity for the signal pad, and modifying the default active state polarity of the signal pad based at least upon the desired active state polarity.

22. The computer system of claim 21, wherein the controller further determines if a predetermined power level threshold of the apparatus is exceeded prior to modifying the default active state polarity of the signal pad.

23. The computer system of claim 22, wherein the controller further modifies the default active state polarity of the signal pad providing that the power level threshold of the apparatus has not been exceeded.

24. The computer system of claim 22, wherein the controller further retains the default active state polarity of the signal pad providing that the power level threshold of the apparatus has been exceeded.

25. The computer system of claim 21, wherein the controller further determines the desired active state polarity of the signal pad by a user of the device.

26. The computer system of claim 21, wherein the controller further monitors a function of the apparatus that is associated with the signal pad, and determines the desired active state polarity of the signal pad based at least in part on the monitoring of the function of the device that is associated with the signal pad.

27. The computer system of claim 21, wherein the controller modifies the default active state polarity of the signal pad based at least upon the desired active state polarity by selecting one of an active-high select fuse and an active-low select fuse.

28. The computer system of claim 21, wherein the controller modifies the default active state polarity of the signal pad based at least upon the desired active state polarity by selecting one of an active-high signal pad and an active-low signal pad.

* * * * *